United States Patent
Ajit

(10) Patent No.: US 6,906,552 B2
(45) Date of Patent: Jun. 14, 2005

(54) SYSTEM AND METHOD UTILIZING A ONE-STAGE LEVEL SHIFT CIRCUIT

(75) Inventor: Janardhanan S. Ajit, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/227,248

(22) Filed: Aug. 26, 2002

(65) Prior Publication Data

US 2003/0102890 A1 Jun. 5, 2003

Related U.S. Application Data

(60) Provisional application No. 60/334,532, filed on Dec. 3, 2001.

(51) Int. Cl.[7] ......................................... H03K 19/0185
(52) U.S. Cl. ............................ 326/81; 326/68; 326/63
(58) Field of Search ......................... 326/62, 68, 81, 326/83; 327/333

(56) References Cited

U.S. PATENT DOCUMENTS

| | | | |
|---|---|---|---|
| 4,808,852 A | | 2/1989 | Kousaka et al. |
| 5,204,557 A | | 4/1993 | Nguyen |
| 5,559,464 A | | 9/1996 | Orii et al. |
| 5,669,684 A | * | 9/1997 | Agan .......................... 326/81 |
| 5,995,010 A | * | 11/1999 | Blake et al. ................. 340/653 |
| 6,034,549 A | | 3/2000 | Matsumoto et al. |
| 6,064,229 A | | 5/2000 | Morris |
| 6,208,167 B1 | * | 3/2001 | Ranjan et al. ................. 326/81 |
| 6,232,794 B1 | | 5/2001 | Cox |
| 6,242,962 B1 | | 6/2001 | Nakamura |
| 6,268,744 B1 | | 7/2001 | Drapkin et al. |

OTHER PUBLICATIONS

European Search Report, EP/02 25 8337 Dec. 2003.

* cited by examiner

*Primary Examiner*—Vibol Tan
(74) *Attorney, Agent, or Firm*—Sterne, Kessler, Goldstein and Fox PLLC

(57) ABSTRACT

A system and method for level shifting a core, lower voltage in a one-stage level shift device to produce a higher, driving voltage. The system includes a first device that optimally functions with a first voltage and that outputs the first voltage. The system also includes a one-stage level shift device that receives the first voltage and shifts the first voltage to a second voltage without an intermediate voltage, the second voltage being higher than the first voltage. The system also includes a second device that receives the second voltage to optimally function. In some cases, the first voltage can be a periodic wave such that the higher voltage is produced with one portion of the level shift device during a first portion of the wave and another portion of the level shift device during a second portion of the wave.

24 Claims, 4 Drawing Sheets

SYSTEM AND METHOD UTILIZING A ONE-STAGE LEVEL SHIFT CIRCUIT

CROSS-REFERENCE TO RELATED APPLICATIONS

This application claims priority under 35 U.S.C. § 119(e) to U.S. Prov. App. No. 60/334,532 filed Dec. 3, 2001, which is incorporated by reference herein in its entirety.

BACKGROUND OF THE INVENTION

1. Field of the Invention

The present invention is directed to a system and method for level shifting between a low voltage circuit and a high voltage circuit.

2. Background Art

Many integrated circuits are being manufactured that have reduced feature sizes and reduced core voltage levels (e.g., about 1–1.5V). These integrated circuits often drive higher voltage level circuits (e.g., operating at about 3–3.3V) at their output. Typically, a multi-stage level shifting device or circuit is positioned between the integrated circuit and the driven device. In this arrangement, one or more intermediate voltages (e.g., of about 2.5V) are required before the final voltage (e.g., about 3–3.3V) is produced. By requiring the intermediate voltage or voltages, the multi-stage level shifter is slowed by propagation delays and requires additional power for the additional level shifting stages. The increased circuit elements and additional required power supply increases the cost of the system. Also, by needing more stages for level shifting a larger overall circuit is required.

Therefore, what is needed is a one-stage level shifting device that allows for increased speed and efficiency during level shifting and reduced costs and size through reduced power requirements and reduced circuit elements.

BRIEF SUMMARY OF THE INVENTION

Embodiments of the present invention provide a system including a first device that optimally functions with a first voltage and that outputs the first voltage. The system also includes a one-stage level shift device that receives the first voltage and shifts the first voltage to a second voltage without an intermediate voltage, the second voltage being higher than the first voltage. The system also includes a second device that receives the second voltage to optimally function.

Other embodiments of the present invention provide a system including an input device operating from a first voltage that outputs the first voltage. The system also includes a one-stage level shift device that receives the first voltage from the input device and shifts the first voltage to a second voltage, the second voltage being higher than the first voltage. The system also includes an output device that receives the second voltage, the output device operating from the second voltage.

Still other embodiments of the present invention provide a method including the step of receiving an input voltage. The method also includes the step of shifting said input voltage directly to a higher output voltage through one stage of a level shift device. The method also includes the step of outputting said output voltage.

Still further embodiments of the present invention provide a system including a one-stage level shift device. The one-stage level shift device includes a first NMOS device coupled at a gate to the first device, a first PMOS device coupled at a drain to a drain of the first NMOS device, wherein a gate of the first PMOS device is coupled to a first predetermined voltage, a second NMOS device coupled at a source to a source of the first PMOS device, and a second PMOS device coupled at a gate to a drain of the second NMOS device and coupled at a drain to the second device. The one-stage level shift device also includes a third NMOS device coupled at a gate to the first device, a third PMOS device coupled at a drain to a drain of the third NMOS device, wherein a gate of the third PMOS device is coupled to a second predetermined voltage, a fourth NMOS device coupled at a source to a source of the third PMOS device, and a fourth PMOS device coupled at a gate to a drain of the fourth NMOS device and coupled at a drain to the third PMOS device. A drain of the second PMOS device is coupled to a drain of the fourth NMOS device. A drain of the fourth PMOS device is coupled to the drain of the second NMOS device. A source of the first NMOS device and a source of the third NMOS device are coupled to ground potential. A source of the second PMOS device and a source of the fourth PMOS device are coupled to a third predetermined potential. The gate of the first NMOS device and the gate of the third NMOS device receive complementary input signals. The gate of the first NMOS device and the gate of the third NMOS device receive fourth predetermined potential that is relatively lower than the third predetermined potential. Output signals at the drain of the second PMOS device and the drain of the fourth PMOS device are coupled to a fifth predetermined voltage that is relatively higher than the third predetermined voltage.

Still further embodiments of the present invention provide a system for performing one-stage level-shifting including a means for receiving an input voltage, a means for shifting the input voltage directly to a higher output voltage using one-stage level shifting, and a means for outputting the output voltage.

An advantage of the above embodiments is that no intermediate stages or voltages are required for the operation of the one-stage level shift circuit, which reduces propagation delays as compared to conventional level shifters.

Another advantage of the above embodiments is that the topography of transistors minimizes voltage stress across gate oxides of the transistors and also minimizes the voltage stress across the drain-source of the transistors.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
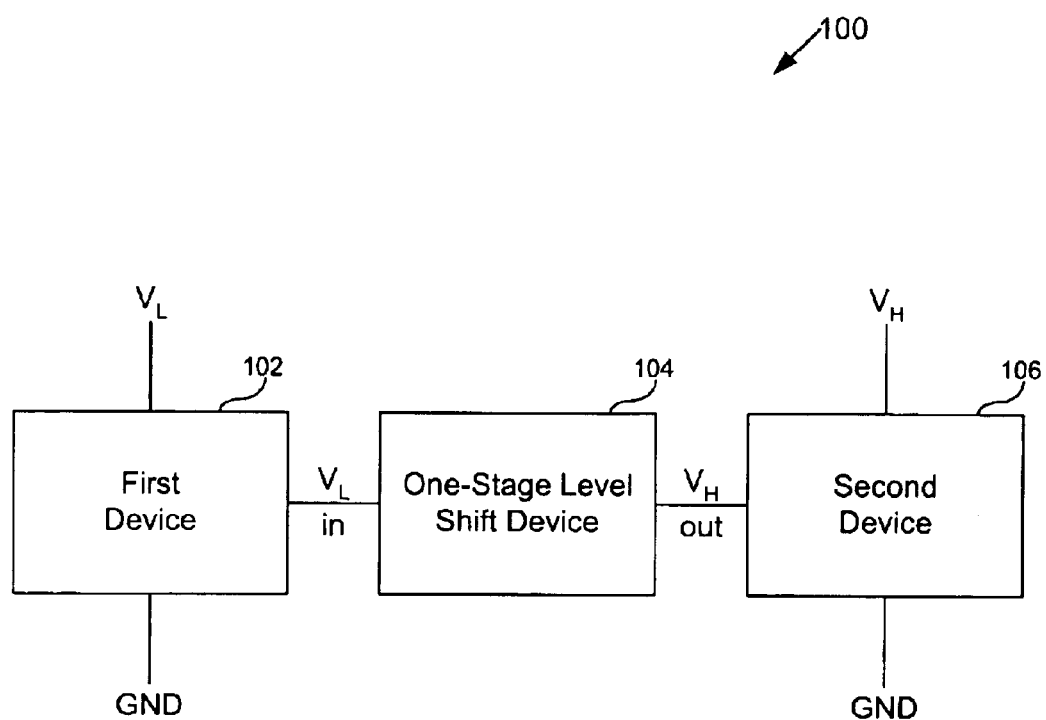
FIG. 1 shows an example system with a one-stage level shifting device according to embodiments of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

FIG. 1 shows a system 100 according to embodiments of the present invention. System 100 includes a first device (e.g., an integrated circuit or an input device) 102, a one-stage level shift device 104, and a second device (e.g., an output device/circuit, a load device/circuit, a driven device/circuit, or the like) 106. First device 102 requires a low core voltage (VL) in order to be optimally powered. In some embodiments, VL can be about 1–1.5V. It is to be appreciated, that in other embodiments VL can be higher or lower than this range. Second device 106 requires a higher core voltage (VH) than VL in order to be optimally powered. In some embodiments, VH can be about 3–3.6V. It is to be appreciated that in other embodiments VH can be higher or lower than this range. Thus, one-stage level shift 104 shifts VL to VH.

Figure 2:
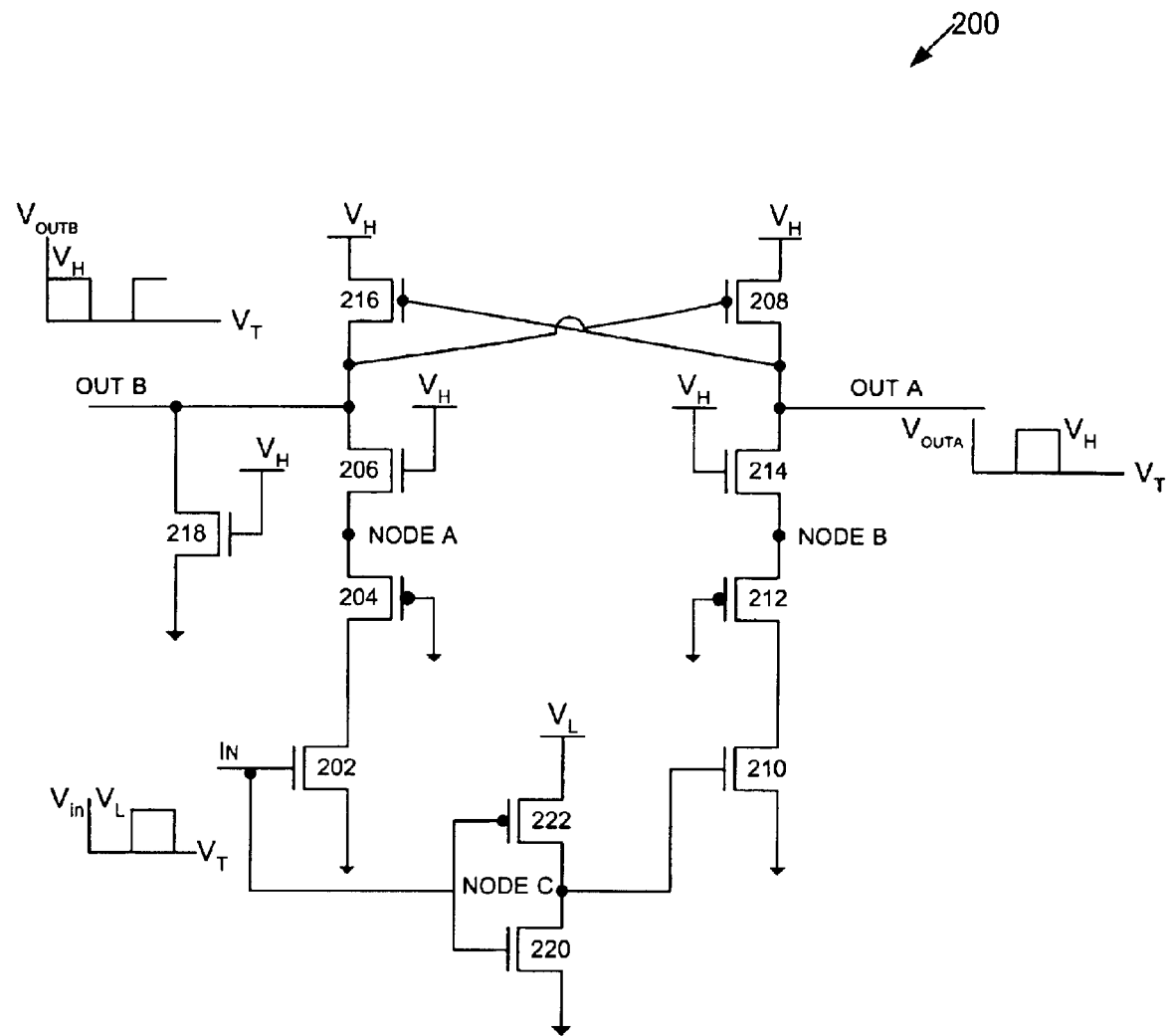
FIG. 2 is a circuit diagram of a one-stage level shifting device according to embodiments of the present invention.

FIG. 2 shows a one-stage level shifting circuit 200 according to embodiments of the present invention. Circuit 200 receives an input voltage (e.g., Vin) from first device 102. Vin can be a periodic signal, for example the square wave signal shown in FIG. 2 and in FIG. 3. In other embodiments, Vin can be other periodic signals. Circuit 200 includes a first set of transistors (e.g., FETS, NMOS, PMOS, etc.) including transistors 202, 204, 206, and 208 and a second set of transistors (e.g., FETS, NMOS, PMOS, etc.) including transistors 210, 212, 214, and 216.

Figure 3:
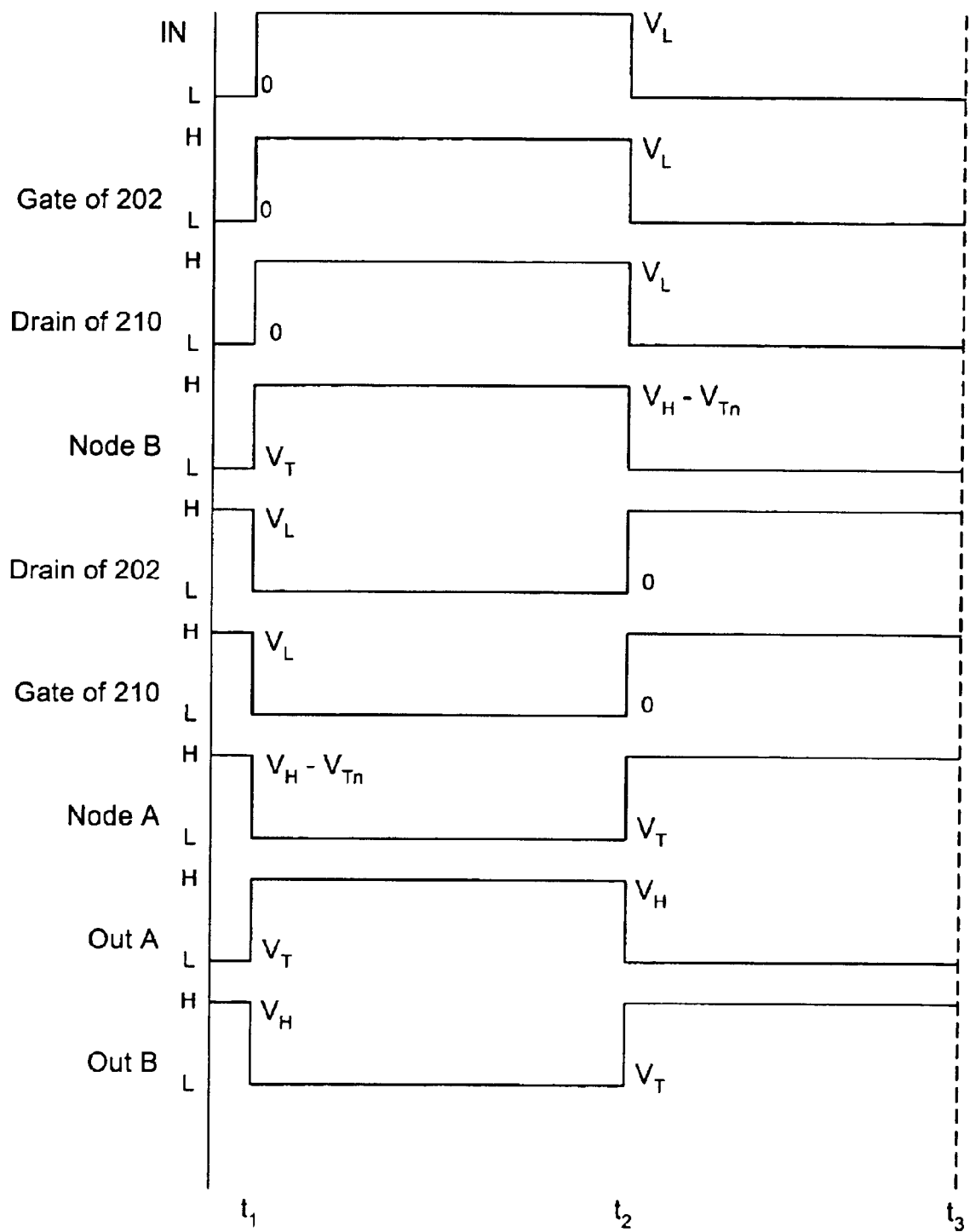
FIG. 3 is a signal diagram of voltage passing through various devices and nodes in the one-stage level shifting device of FIG. 2.

Turning to FIG. 3, and with continuing reference to FIG. 2, while Vin is transitioning from low (0V) to high (VL) and while Vin is high, transistors 210, 212, 214, and 216 are OFF (i.e., not conducting) and a gate of transistor 202 (coupled at its source to a drain of 204 and at its drain to ground) is high (VL), turning transistor 202 ON. Transistor 204 (coupled at its gate to ground and at its source to a drain of 206) is ON. While transistor 204 is conducting, Node A is pulled down to a predetermined voltage level (e.g., about 1V). The predetermined voltage level at Node A is limited by a threshold voltage (VT) of transistor 204 to V(Node A)≈VH-transistor 204(VT).

With continuing reference to FIGS. 2 and 3, while transistor 202 and 204 are conducting, transistor 206 (coupled at its gate to VH and at its source to node Out A) is turned ON. While transistors 202, 204, and 206 are conducting, node Out B (node Out B couples a drain of transistors 206 and 218, a gate of transistor 208, and a drain of transistor 216) is about equal to the VT of transistor 204 (e.g., about 1V) taking into consideration body-bias effects. Also, while transistors 202, 204, and 206 are conducting, a gate of transistor 208 (coupled at a source to VH and a drain to node Out A) is pulled low (e.g., about 1V), turning transistor 208 ON. While transistor 208 is conducting, a voltage VH (e.g., about 3–3.6V) is produced at its drain, which is also node Out A (node Out A couples the drain of transistor 208, a drain of transistor 214, and a gate of transistor 216). While node Out A is at VH, transistor 216 is turned OFF.

With continuing reference to FIGS. 2 and 3, while Vin is transitioning from high (VL) to low (0V) and while Vin is low, transistors 202 and 208 are OFF (i.e., not conducting) and a gate of transistor 210 (coupled at its drain to a drain of 212 and at its source to ground) is high (VL), which turns transistor 210 ON. Transistor 210 receives voltage at its gate from Node C that couples a drain of transistor 220 and a source of transistor 222. Transistors 220 and 222 receive voltage Vin at their gates, respectively. While transistor 210 is conducting, transistor 212 (coupled at its gate to ground and at its source to a drain of transistor 214) is turned ON. While transistors 210 and 212 are conducting, Node B (Node B couples the source of 212 and the source of 214) is pulled to a predetermined voltage level (e.g., about 1V). This predetermined voltage level is limited by VT of transistor 212.

With continuing reference to FIGS. 2 and 3, while transistor 212 is conducting, transistor 214 (coupled at its gate to VH and at its source to node Out A) is turned ON. This pulls Node A low (e.g., VT is about 1V). While transistor 214 is conducting, the gate of transistor 216 (coupled at its source to VH, at its gate to node Out A, and at its drain to node Out B) is pulled low (VT), turning transistor 216 ON. While transistor 216 is conducting, the voltage at node Out B is VH (e.g., about 3–3.3V). While the voltage at node Out B is about VH, the gate of transistor 208 is pulled high (VH), which turns transistor 208 OFF. While transistor 216 is conducting and transistor 208 is not conducting, the voltage at node Out A is equal to VT of transistor 212 (e.g., about 1 V) taking into consideration body-bias effects. The voltage at Node A in this case is VH-VTn. VTn is the threshold voltage of transistor 206 taking into consideration body bias effects. Thus, the maximum voltage of nodes Node A and Node B are limited to VH-VTn. The minimum voltage of nodes Out A and Out B are limited to VT.

Again with reference to FIG. 2, in the embodiment shown transistors 202, 206, 210, 214, 218, and 220 can be NMOS devices and transistors 204, 208, 212, 216, and 222 can be PMOS devices. It is to be appreciated that in other embodiments or other devices or arrangement of devices can be used to perform one-stage level shifting.

Figure 4:
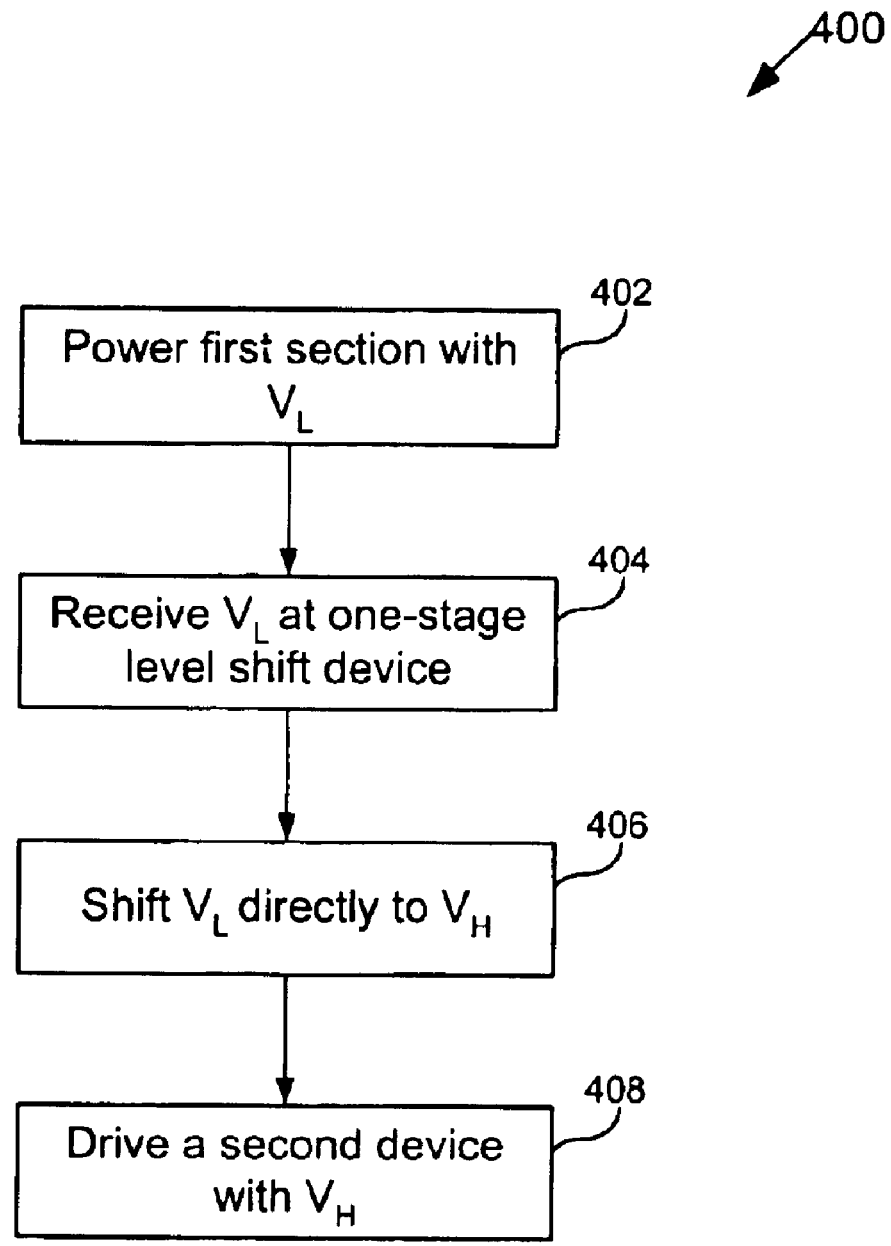
FIG. 4 is a flowchart depicting a method of performing one-stage level shifting according to embodiments of the present invention.

FIG. 4 shows a method 400 for performing one-stage level shifting according to embodiments of the present invention. At step,402, an input voltage (e.g., VL) is used to optimally power a first section (e.g., 102) of a system (e.g., 100). At step 404, the input voltage is received at a one-stage level shift device (e.g., 104 or 200). At step 406, the input voltage is shifted directly to a higher output voltage (e.g., VH). At step 408, the higher voltage is used to drive a driven device (e.g., 106), which requires the higher voltage to optimally function.

In some embodiments, the output voltage VH can be generated at two outputs nodes (Node Out A and Out B) if the input voltage is a periodic wave (e.g., a square wave). In those embodiments, the higher output voltage is generated at Node Out B by a first portion (e.g., transistors 202, 204, 206, and 208) of the one-stage level shift device during a first time period and the higher output voltage is generated with a second portion (e.g., transistors 210, 212, 214, and 216) of the one-stage level shift device during a second time period. In these embodiments, a first time period occurs during a transition from a lower voltage to higher voltage and during the higher voltage of the periodic wave. Also, in these embodiments, the second time period occurs during a transition from the higher voltage to the lower voltage and during the lower voltage of the periodic wave. It is to be appreciated, a one-stage level shift device and/or circuit can be configured so that the first and second portions can function during opposite time periods.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system comprising:
   a first device that optimally functions with a first voltage and that outputs said first voltage;
   a one-stage level shift device that receives said first voltage and generates a single output voltage that is higher than said first voltage, the level shift device comprising,
      a first set of transistors that generate said output voltage during a first time period, and
      a second set of transistors that generate said output voltage during a second time period,
      wherein at least one of the first set of transistors and the second set of transistors comprises two PMOS devices and two NMOS devices; and
   a second device that receives said output voltage to optimally function,
   whereby said one-stage level shift device shifts said first voltage to said output voltage without an intermediate voltage.

2. The system of claim 1, wherein said first device requires said first voltage to operate.

3. The system of claim 1, wherein said second device requires said second voltage to operate.

4. The system of claim 1, wherein said first set of transistors comprises a plurality of FET devices.

5. The system of claim 1, wherein said first set of transistors comprises the two PMOS devices and two NMOS devices.

6. The system of claim 1, wherein said second set of transistors comprises a plurality of FET devices.

7. The system of claim 1, wherein said second set of transistors comprises the two PMOS devices and two NMOS devices.

8. The system of claim 1, wherein said first set of transistors comprises:
   a first FET device coupled to said first device at a gate;
   a second FET device coupled at a drain to a source of said first FET device;
   a third FET device coupled at a drain to a source of said second FET device; and
   a fourth FET device coupled at a gate to a source of said third FET device and coupled to said second device.

9. The system of claim 1, wherein said second set of transistors comprises:
   a first FET device coupled to said first device at a gate;
   a second FET device coupled at a drain to a source of said first FET device;
   a third FET device coupled at a drain to a source of said second FET device; and
   a fourth FET device coupled at a gate to a source of said third FET device and coupled to said second device.

10. The system of claim 1, wherein:
    said first voltage is in the form of a periodic signal;
    said first time period occurs during a transition from a lower voltage to a higher voltage and during said higher voltage of said periodic signal; and
    said second time period occurs during a transition from said higher voltage to said lower voltage and during said lower voltage of said periodic signal.

11. The system of claim 1, wherein said first set of transistors comprises:
    a first NMOS device coupled at a gate to said first device;
    a first PMOS device coupled at a drain to a drain of said first NMOS device, wherein a gate of said first PMOS device is coupled to a relatively low voltage;
    a second NMOS device coupled at a source to a source of said first PMOS device; and
    a second PMOS device coupled at a gate to a drain of said second NMOS device and coupled at a drain to said second device.

12. The system of claim 1, wherein said second set of transistors comprises:
    a first NMOS device coupled at a gate to said first device;
    a first PMOS device coupled at a drain to a drain of said first NMOS device, wherein a gate of said first PMOS is coupled to a predetermined voltage;
    a second NMOS device coupled at a source to a source of said first PMOS device; and
    a second PMOS device coupled at a gate to a drain of said second NMOS device and coupled at a drain to said second device.

13. The system of claim 1, wherein:
    the two NMOS devices in the first set of transistors include first and second NMOS devices and the two PMOS devices in the first set of transistors include first and second PMOS devices, wherein,
       the first NMOS device is coupled at a gate to said first device;
       the first PMOS device is coupled at a drain to a drain of said first NMOS device, wherein a gate of said first PMOS device is coupled to a first predetermined voltage;

the second NMOS device is coupled at a source to a source of said first PMOS device; and the second PMOS device is coupled at a gate to a drain of said second NMOS device and coupled at a drain to said second device;

the two NMOS devices in the second set of transistors includes third and fourth NMOS devices and the two PMOS devices in the second set of transistors include third and fourth PMOS devices, wherein, the third NMOS device is coupled at a gate to said first device;

the third PMOS device is coupled at a drain to a drain of said third NMOS device, wherein a gate of said third PMOS device is coupled to a second predetermined voltage;

the fourth NMOS device is coupled at a source to a source of said third PMOS device; and the fourth PMOS device is coupled at a gate to a drain of said fourth NMOS device and coupled at a drain to said third PMOS device;

a drain of said second PMOS device is coupled to a drain of said fourth NMOS device; and a drain of said fourth PMOS device is coupled to said drain of said second NMOS device.

14. The system according to claim 1, wherein said first voltage is around 3–3.6V.

15. The system of claim 1, wherein said output voltage is around 1–1.2V.

16. A system comprising a one-stage level shift device, the one-stage level shift device comprising:

a first NMOS device coupled at a gate to said first device;

a first PMOS device coupled at a drain to a drain of said first NMOS device, wherein a gate of said first PMOS device is coupled to a first predetermined voltage;

a second NMOS device coupled at a source to a source of said first PMOS device;

a second PMOS device coupled at a gate to a drain of said second NMOS device and coupled at a drain to a second device;

a third NMOS device coupled at a gate to said first device;

a third PMOS device coupled at a drain to a drain of said third NMOS device, wherein a gate of said third PMOS device is coupled to a second predetermined voltage;

a fourth NMOS device coupled at a source to a source of said third PMOS device; and a fourth PMOS device coupled at a gate to a drain of said fourth NMOS device and coupled at a drain to said third PMOS device;

wherein a drain of said second PMOS device is coupled to a drain of said fourth NMOS device;

wherein a drain of said fourth PMOS device is coupled to said drain of said second NMOS device;

wherein a source of said first NMOS device and a source of said third NMOS device are coupled to ground potential;

wherein a source of said second PMOS device and a source of said fourth PMOS device are coupled to a third predetermined potential;

wherein said gate of said first NMOS device and said gate of said third NMOS device receive complementary input signals;

wherein said gate of said first NMOS device and said gate of said third NMOS device receive fourth predetermined potential that is relatively lower than said third predetermined potential;

wherein output signals at said drain of said second PMOS device and said drain of said fourth PMOS device are coupled to a fifth predetermined voltage that is relatively higher than said third predetermined voltage.

17. A system for performing one-stage level-shifting comprising:

means for receiving an input voltage;

means for shifting the input voltage directly to a higher output voltage using one-stage level shifting, the shifting means comprising, first means for generating the output voltage during a first portion of the one-stage level shifting during a first time period; and second means for generating the output voltage during a second portion of the one-stage level shifting during a second time period, wherein at least one of the first and second means for generating comprises two PMOS devices and two NMOS devices; and means for outputting the output voltage.

18. The system of claim 17, further comprising:

using a periodic wave as the input voltage, wherein, a first time period is during a transition of the periodic wave from a lower voltage to a higher voltage and during the higher voltage; and a second time period is during a transition of the periodic wave from the higher voltage to the lower voltage and during the lower voltage.

19. The system of claim 17, wherein said means for receiving receives a voltage in a range of 0.8V–1.6V as the input voltage.

20. The system of claim 17, wherein said means for shifting outputs a voltage in a range of 2.9V–3.7V as the output voltage.

21. The system of claim 17, wherein said means for shifting comprises means that can handle less than 2.8V during the one-stage level shifting.

22. The system of claim 13, wherein:

a source of said first NMOS device and a source of third NMOS device are coupled to ground potential; and a source of said second PMOS device and a source of fourth PMOS device are coupled to a third predetermined potential.

23. The system of claim 22, wherein said gate first NMOS device and said gate of said third NMOS device complementary input signal.

24. The system of claim 23, wherein:

said gate of said first NMOS device and said gate of said third NMOS device receive a fourth predetermined potential that is relatively lower than said third predetermined potential; and output signals at said drain of said second PMOS device and said drain of said fourth PMOS device are coupled to a fifth predetermined voltage that is relatively higher than said third predetermined voltage.

* * * * *

UNITED STATES PATENT AND TRADEMARK OFFICE
CERTIFICATE OF CORRECTION

PATENT NO. : 6,906,552 B2
DATED : June 14, 2005
INVENTOR(S) : Janardhanan S. Ajit It is certified that error appears in the above-identified patent and that said Letters Patent is hereby corrected as shown below:

Column 8,
Line 12, "input voltage directly to a higher" should appear as -- input voltage directly to a single higher --.
Line 47, "PMOS device and a source of said" should appear as -- PMOS device and a source of said --.
Line 51, "wherein said gate first NMOS" should appear as -- written said gate of said first NMOS --.
Line 52, "said third NMOS device" should appear as -- said third NMOS device receive --.
Line 53, "input signal" should appear as -- input signals --.

Signed and Sealed this

Eighth Day of November, 2005

JON W. DUDAS
*Director of the United States Patent and Trademark Office*